United States Patent [19]

Lippincott

[11] Patent Number: 4,620,707
[45] Date of Patent: Nov. 4, 1986

[54] NON-VOLATILE REPROGRAMMABLE RAM CARTRIDGE

[75] Inventor: Louis A. Lippincott, Roebling, N.J.

[73] Assignee: Syntex Computer Systems, Inc., Bordentown, N.J.

[21] Appl. No.: 508,111

[22] Filed: Jun. 27, 1983

[51] Int. Cl.[4] .............................................. A63F 9/22
[52] U.S. Cl. ...................... 273/148 B; 273/DIG. 28; 365/233
[58] Field of Search .................. 273/DIG. 28, 148 B; 365/233, 228

[56] References Cited

U.S. PATENT DOCUMENTS

| 3,859,638 | 1/1975 | Hume, Jr. ........................ 365/228 |
| 4,145,760 | 3/1979 | Ward et al. ..................... 365/229 |
| 4,156,928 | 5/1979 | Inose et al. ................ 273/DIG. 28 |
| 4,159,541 | 6/1979 | Ward et al. ...................... 365/63 |
| 4,247,106 | 1/1981 | Jeffers et al. ............. 273/DIG. 28 |
| 4,388,706 | 6/1983 | Butler .............................. 365/228 |
| 4,399,524 | 8/1983 | Muguruma et al. ................ 365/228 |
| 4,403,309 | 9/1983 | Nakano .............................. 365/228 |
| 4,432,067 | 2/1984 | Nielsen ....................... 273/DIG. 28 |

OTHER PUBLICATIONS

Stephen W. Fields, "E-PROM Cartridges Change the Action in Games People Play", 5/31/83, Electronics Magazine, May/83.

Primary Examiner—Leo P. Picard
Attorney, Agent, or Firm—Sanford J. Asman

[57] ABSTRACT

The reprogrammable RAM cartridge of the present invention is adapted for use as a reprogrammable video game. The cartridge uses an optoisolator connected in a circuit between the shield and ground lines to detect the presence of a signal indicating that the cartridge is in a programmer, rather than in a video game unit. While in the programmer, the program stored in the RAM can be changed. However, when removed from the programmer, the cartridge acts like a standard video game cartridge.

4 Claims, 2 Drawing Figures

NON-VOLATILE REPROGRAMMABLE RAM CARTRIDGE

BACKGROUND OF THE INVENTION

The present invention relates to a reprogrammable RAM cartridge for use in a microprocessor based system. In particular, it relates to a reprogrammable cartridge of the type which can be used to replace a fixed program cartridge of the type typically found in video games.

Many microprocessor based systems, such as video games, rely upon a memory cartridge which typically contains some type of read only memory (ROM). The ROM may be either a mask programmable ROM, meaning that the program contained therein is placed in the ROM at the time of its manufacture, or the ROM may be reprogrammable after erasure either via the use of an ultraviolet light, in the case of what is commonly called an eraseable programmable read only memory (EPROM), or via the use of an electrical signal, in the case of what is commonly called an electrically eraseable programmable read only memory (EE-PROM) or an electrically alterable read only memory (EAROM). As used herein, the term "ROM" will refer to the standard mask programmable ROM unless otherwise specified.

While a ROM provides the lowest unit cost of manufacturing memory cartridges, assuming that the volume is large enough to justify the initial outlay to create the special purpose mask used in manufacturing the ROM, a ROM cannot be reprogrammed once it has been manufactured. Accordingly, each game cartridge, in the case of a video game, is dedicated from the time of its manufacture. Any change in games, or any change in the program of a particular game, requires a new game cartridge containing a new ROM. As the unit price of a game cartridge is determined by a combination of factors, including license fees, cost of manufacture, and cost of distribution, the collection of a number of game cartridges becomes very expensive for the game owner. This is unfortunate, because old games eventually become obsolete or boring, and continuous replacement of old games becomes expensive and tiresome.

Efforts on the part of third party suppliers to produce new, inexpensive games have heretofore been impeded to some extent by a variety of tactics employed by the game manufacturers. These tactics include restricting the distribution of information regarding the manner in which the games operate, and manufacturing cartridges which have a plug configuration, i.e. a pinout, which prevents them from being readily connected to a device other than the manufacturer's video game unit. Thus, even if one were to want to design a game cartridge which contained a reprogrammable memory unit, its design would be complicated by the current design of typical game cartridges. Accordingly, it would be desirable to be able to produce a reprogrammable game cartridge which could be used in conjunction with standard types of video games.

SUMMARY OF THE INVENTION

The present invention is a reprogrammable game cartridge which may be connected to a standard video game or to a game programmer. The reprogrammable game cartridge preferably contains at least one low power random access memory (RAM) designed to store data, such as a program for a video game. The cartridge includes means for determining whether it is connected to a game unit, in which case the write line of the RAM is disabled, or to a programmer, in which case the write line can be enabled. Also, the reprogrammable game cartridge includes means for enabling the write enable line and the chip enable lines of the RAM included within the cartridge. Accordingly, the reprogrammable game cartridge can be used in the same manner as a standard game cartridge when connected to a video game unit. Alternatively, when the reprogrammable game cartridge is connected to a game programmer, it is possible to write a new game into the RAM. Voltage supply means maintains the program in memory when the reprogrammable game cartridge is not connected to an external power supply.

DETAILED DESCRIPTION OF THE PREFERRED EMBODIMENT

The present invention will herein be described in the context of a reprogrammable video game cartridge designed to fit into a popular video game unit called the Atari 2600 VCS, manufactured by Atari, Inc. of Sunnyvale, Calif. While the description herein is, therefore, specific, the inventive concept is generic to other types of video games or to other microprocessor based systems, as will be apparent to those skilled in the art.

The Atari 2600 VCS video game, has a socket into which a video game cartridge is inserted. The video game cartridge typically contains a ROM having the program for a game permanently fixed thereon as described above. The socket for the game cartridge has a pin-out configuration which is designed specifically for the single purpose of enabling a plug compatible video game cartridge to be plugged in. Accordingly, the number and designation of the pins on the Atari 2600 VCS game unit is fixed and cannot be changed. There are no spare pins available on the cartridge or on the game unit. Accordingly, the Atari 2600 VCS unit is considered to be a "worst case" example of the present invention's applicability.

Figure 1:
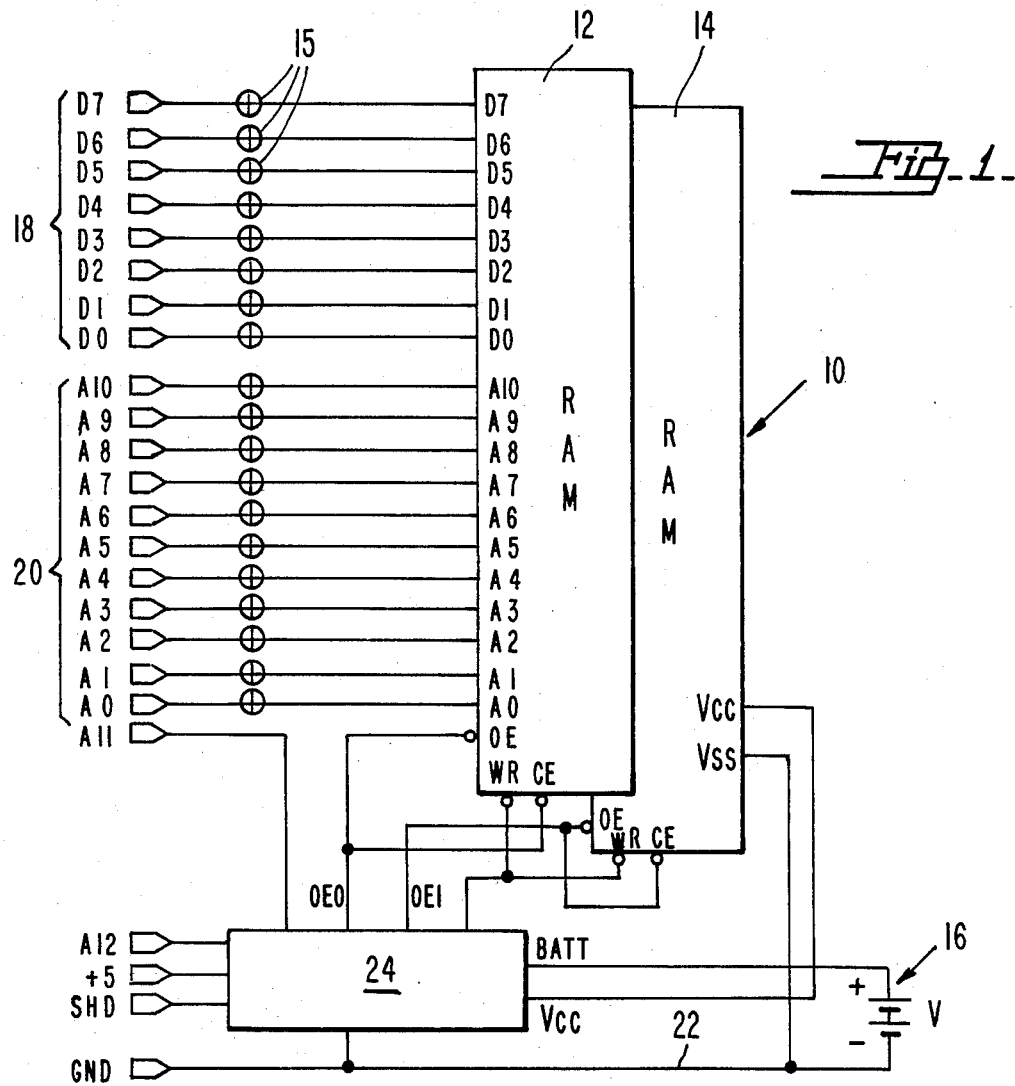
FIG. 1 is a schematic diagram of the reprogrammable game cartridge of the present invention.

Referring generally to FIG. 1, a schematic diagram of the reprogrammable game cartridge 10 of the present invention is shown. The Atari 2600 VCS game unit, for example, has twenty-four pins, shown on the left side of the schematic diagram of the reprogrammable game cartridge 10. The purpose of each of the pins is designated by the design of the game unit. In the Atari 2600 VCS game unit, there is an eight line data bus (D0-D7), an eleven line address bus (A0-A10), a ground pin (GND), a positive voltage supply pin (+5), a shield pin (SHD), a memory chip select pin (A11), and a cartridge select pin (A12). Thus, if one wanted to replace the standard Atari 2600 VCS game cartridge with any other game cartridge, whether reprogrammable or not, it is necessary to use the same pin-out as is used by a standard Atari 2600 VCS game cartridge. Heretofore, this has presented a problem to anyone trying to construct a reprogrammable game cartridge designed to fit into an Atari 2600 VCS game unit in that a reprogrammable cartridge, containing at least one RAM requires a separate pin for the write enable line. In the situation in which there are no unused pins, it is extremely difficult to design a reprogrammable cartridge which looks and acts like a standard game cartridge and which does not require some type of snap open case for access to the memory chips or to extra pins. Due to the environment in which video game cartridges are used, it is highly desirable to be able to provide a completely sealed cartridge. Also, avoiding extra pins or snap open cases (required, for example, if an ultraviolet eraseable EPROM is used) simplifies the programmer operator's task, which is important to make the programmer unit, required to enter data into the cartridge, as simple to operate and as fool proof as possible.

In the configuration shown in FIG. 1, the reprogrammable game cartridge 10 comprises a pair of complementary symmetry metal oxide semiconductor (CMOS) RAM circuits 12, 14. The CMOS RAMs 12, 14 are low power memory circuits whose memory is preserved by the use of a battery 16 contained within the reprogrammable game cartridge 10. Accordingly, when the reprogrammable game cartridge 10 is plugged into a standard Atari 2600 VCS game unit, it is pin for pin compatible with a standard Atari 2600 VCS game cartridge, and it acts in an identical manner. However, unlike a standard Atari 2600 VCS game cartridge, the reprogrammable game cartridge 10 of the present invention can be removed from the Atari 2600 VCS and placed in a programmer (not shown) in order to change the program contained in the cartridge 10.

As shown in FIG. 1, the CMOS RAMs 12, 14 used in the preferred embodiment of the invention are standard Hitachi HM6116LP 2K×8 bit static CMOS RAMs which have their data lines, D0–D7, connected in parallel on a data bus 18. They also have their address lines A0–A10 connected in parallel on an address bus 20. There are high impedance resistors 15, having a typical resistance of about one megohm connected between each line of the data and address buses 18, 20 and ground. These resistors 15 may be replaced by a high resistance conductive coating, such as a foam or solder mask, as will be obvious to those skilled in the art. The Vss pins of the CMOS RAMs 12, 14 are connected together and to a ground (GND) line 22, and the remaining pins of the CMOS RAMs 12, 14 are connected to a circuit called the "generic video game" circuit 24.

Figure 2:
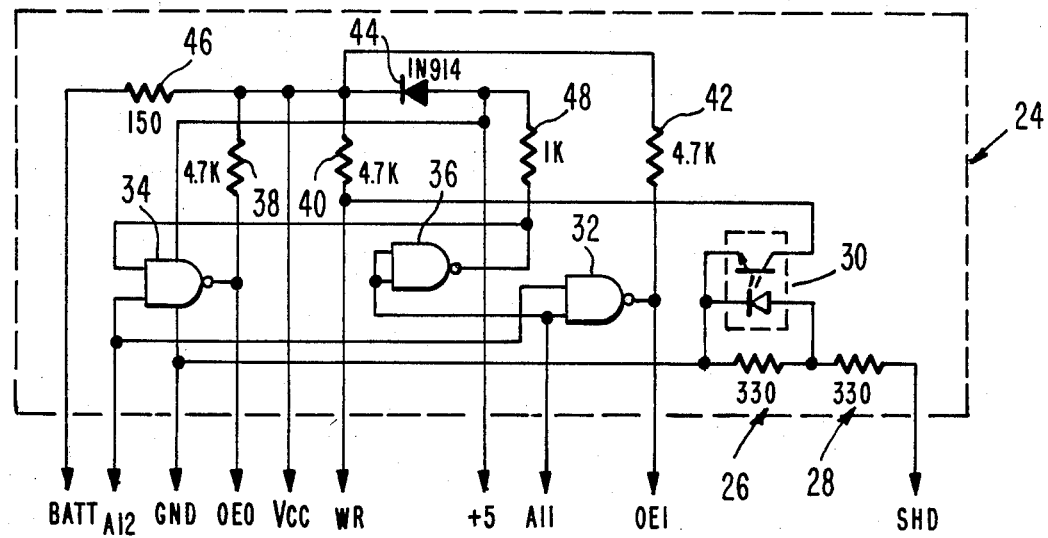
FIG. 2 is a schematic diagram of the generic video game circuit of the reprogrammable game cartridge.

Referring generally to FIG. 2, the schematic diagram for the generic video game circuit 24 is shown. Key to the present invention, the shield line, SHD, and the ground line GND, which are normally connected together in a standard video game cartridge, are connected in series in the generic video game circuit 24 through a pair of 330 ohm resistors 26, 28. One of the resistors 26, has an optoisolator 30, a Texas Instruments TIL111, connected in parallel across it. Accordingly, if the cartridge 10 is placed into a programmer which imposes a voltage of about 5 volts on the SHD pin relative to the GND pin, the optoisolator 30 turns on connecting the write enable line, WR, to GND. Pulsing one of the chip enable lines, OE0 and OE1, connected to the chip enable (CE) pins on the RAMs 12, 14, respectively, permits writing into the selected RAM 12, 14.

The generic video game circuit 22 further comprises three NAND gates 32, 34, 36, preferably 74LS03 integrated circuits. NAND gates 32, 34 have as one input, the cartridge select line A12. As their other input, they have A11 and NOT A11, respectively. The signal on line A11 is used as the RAM select to enable a selected one of the RAMs 12, 14. Two RAMs 12, 14 are used in this embodiment of the invention, because standard Atari 2600 VCS game cartridges have either 2K or 4K bytes of memory. Accordingly, the present reprogrammable video game cartridge 10 is configured with 4K bytes of CMOS RAM.

NAND gate 36 is used as an inverter with line A11 going to both inputs and NOT A11 as its output. Thus, the signal on line OE0, i.e. the output of NAND gate 34, will be low only when the signal on line A12 is high and the signal on line A11 is low. Similarly, the signal on line OE1, i.e. the output of NAND gate 32, will be low only when the signal on lines A11 and A12 are both high. At all other times, the signals on lines OE0 and OE1 will be kept high by 4.7K pull-up resistors 38, 42. Similarly, 4.7K pull-up resistor 40 is used to keep the write enable line, WR, high when there is no signal being supplied to the optoisolator 30 by the programmer.

As will be understood by those skilled in the art, to program the RAMs 12, 14, the reprogrammable video game cartridge 10 is placed into a programmer and 5 volts is imposed upon the SHD line, turning on the optoisolator 30, thereby bringing the WR line to ground. With A12 also at 5 volts and A11 at ground, OE0, connected to the OE line of RAM 12, will be brought low and a program can be loaded into RAM 12. Similarly, changing the signal on A11 to 5 volts brings OE1 low to load a program into RAM 14.

When the reprogrammable video game cartridge 10 is disconnected from the programmer, the programs are preserved in the RAMs 12, 14 by bringing the WR line up to the potential of the internal battery 16 through pull-up resistor 40. A diode 44 prevents the internal battery 16 from powering a video game unit that the reprogrammable video game cartridge 10 is in when the video game unit is turned off.

A 150 ohm resistor 46 is connected in series with the internal battery 16 if a rechargeable internal battery 16 is used. The resistor 46 permits voltage difference to exist between the internal battery 16 and the power supply of the game unit. The resistor 46 would be replaced by a diode if the battery 16 is not a rechargeable battery. In that instance, the anode of the diode replacing the resistor 46 would be connected to the positive terminal of the battery 16, and the cathode of the diode would be connected to the cathode of the diode 44. A 1K resistor 48 serves to allow the output of the inverter NAND gate 36 to go high enough to satisfy the input voltage requirements of NAND gate 34.

As will be understood by those skilled in the art, the present invention provides means for generating a write enable signal to permit writing into the RAMs 12, 14 without the need for adding to the pin count of the cartridge and without the need for adding extra pins which would be used solely for programming. While one specific embodiment of the invention has been described, those skilled in the art will recognize that numerous variations can be constructed to fit specific requirements without departing from the spirit or scope of the present invention.

In addition, while the present invention has been described in the context of a program storage means game cartridge for a microprocessor based game system, the present invention could also be used as a data storage means or in microprocessor based systems other than games.

I claim:

1. A reprogrammable RAM cartridge comprising:
   (a) at least one RAM which can store data;
   (b) means for preserving the data stored in said RAM; and
   (c) circuit means for writing into said RAM which can be activated by placing a signal between two pins on said cartridge which would normally have a voltage potential across them which is less than would be required to enable the write line of said RAM when said cartridge is used in its intended application, said two pins being the shield pin and the ground pin of said cartridge, and said circuit means comprising at least one resistor connected between said shield pin and said ground pin together with means for detecting current flow through said resistor comprising an optoisolator having its LED connected in parallel across said resistor, and the outputs of said optoisolator adapted to bring a write enable line of said RAM to ground, whereby it is possible to enable the write line of said RAM by imposing a voltage between said shield pin and said ground pin.

2. The reprogrammable RAM cartridge of claim 1 wherein said means for preserving the stored data in said RAM comprises an internal battery.

3. The reprogrammable RAM cartridge of claim 2 wherein said cartridge is a video game program cartridge and said data is comprised of a video game.

4. The reprogrammable RAM cartridge of claim 1 wherein said cartridge is a video game program cartridge and said data is comprised of a video game program.

* * * * *